US012799582B2

(12) United States Patent
Brick

(10) Patent No.: US 12,799,582 B2
(45) Date of Patent: Nov. 17, 2026

(54) AREA SELECTIVE ATOMIC LAYER DEPOSITION OF METAL OXIDE OR DIELECTRIC LAYER ON PATTERNED SUBSTRATE

(71) Applicant: Gelest, Inc., Morrisville, PA (US)

(72) Inventor: Chad Michael Brick, Yardley, PA (US)

(73) Assignee: GELEST, INC., Morrisville, PA (US)

( * ) Notice: Subject to any disclaimer, the term of this patent is extended or adjusted under 35 U.S.C. 154(b) by 0 days.

(21) Appl. No.: 18/137,157

(22) Filed: Apr. 20, 2023

(65) Prior Publication Data

US 2023/0340660 A1 Oct. 26, 2023

Related U.S. Application Data

(60) Provisional application No. 63/333,286, filed on Apr. 21, 2022.

(51) Int. Cl.
*C23C 16/04* (2006.01)
*C23C 16/02* (2006.01)
(Continued)

(52) U.S. Cl.
CPC .............. *C23C 16/04* (2013.01); *C23C 16/02* (2013.01); *C23C 16/407* (2013.01); *C23C 16/4554* (2013.01); *C23C 16/45553* (2013.01)

(58) Field of Classification Search
CPC ....... C23C 16/04; C23C 16/02; C23C 16/407; C23C 16/4554; C23C 16/45553;
(Continued)

(56) References Cited

U.S. PATENT DOCUMENTS 9,425,038 B2 8/2016 Shimizu
9,786,491 B2 10/2017 Suzuki et al.
(Continued)

FOREIGN PATENT DOCUMENTS

CN 113661269 A 11/2021
JP 2018-182322 A 11/2018
(Continued)

OTHER PUBLICATIONS

Xu et al., "Functionalization of the SiO2 Surface with Aminosilanes to Enable Area-Selective Atomic Layer Deposition of Al2O3," Langmuir, vol. 38 pp. 652-660 (2022).
(Continued)

*Primary Examiner* — Gordon Baldwin
*Assistant Examiner* — Christina D Mcclure
(74) *Attorney, Agent, or Firm* — Panitch Schwarze Belisario & Nadel LLP

(57) ABSTRACT

The selective deposition of a metal oxide or dielectric layer on non-metallic substrates without concomitant growth on metallic substrates using cyclic azasilanes, cyclic thiasilanes, or cyclic tellurasilanes to inhibit growth on the metal surface is described. Films over seven nanometers thick can be grown on dielectric substrates, such as thermal silicon dioxide and silicon, without any growth observed on metallic areas such as copper. Such dielectric-on-dielectric (DoD)
(Continued)

Thickness v. Time for Films of Examples 1 and 2 and Comparative Examples 1 and 2 growth is a critical element of many proposed fabrication schemes for future semiconductor device fabrication such as fully self-aligned vias.

22 Claims, 1 Drawing Sheet

(51) Int. Cl.
*C23C 16/40* (2006.01)
*C23C 16/455* (2006.01)
(58) Field of Classification Search
CPC ........... C23C 16/0272; C23C 16/45534; H10P 14/20; H10P 14/61; H10P 14/6339; H10P 14/6939
See application file for complete search history.

(56) References Cited

U.S. PATENT DOCUMENTS

| | | | |
|---|---|---|---|
| 9,786,492 | B2 | 10/2017 | Suzuki et al. |
| 9,895,715 | B2 | 2/2018 | Haukka et al. |
| 10,047,435 | B2 | 8/2018 | Haukka et al. |
| 10,460,930 | B2 | 10/2019 | Hausmann et al. |
| 10,510,529 | B2 | 12/2019 | Suzuki et al. |
| 10,510,546 | B2 | 12/2019 | Basu et al. |
| 10,586,734 | B2 | 3/2020 | Tapily |
| 10,847,363 | B2 | 11/2020 | Tapily |
| 10,900,120 | B2 | 1/2021 | Sharma et al. |
| 10,941,301 | B2 | 3/2021 | Seki |
| 10,961,624 | B2 | 3/2021 | Arkles et al. |
| 11,087,973 | B2 | 8/2021 | Feurprier et al. |
| 11,164,745 | B2 | 11/2021 | Saly et al. |
| 11,170,993 | B2 | 11/2021 | Tois et al. |
| 11,358,976 | B2 | 6/2022 | Seki et al. |
| 11,371,136 | B2 | 6/2022 | Bhuyan et al. |
| 11,396,701 | B2 | 7/2022 | Sharma et al. |
| 11,417,515 | B2 | 8/2022 | Bhuyan et al. |
| 11,658,068 | B2 | 5/2023 | Tapily |
| 11,702,733 | B2 | 7/2023 | Kalutarage et al. |
| 11,728,164 | B2 | 8/2023 | Tois et al. |
| 11,818,775 | B2 | 11/2023 | Shiotani |
| 11,898,240 | B2 | 2/2024 | Illiberi et al. |
| 2005/0032352 | A1* | 2/2005 | Farrar ............... H01L 21/76849 438/629 |
| 2012/0088369 | A1 | 4/2012 | Weidman et al. |
| 2015/0170961 | A1 | 6/2015 | Romero et al. |
| 2017/0141295 | A1* | 5/2017 | Ekerdt ................... H10N 50/01 |
| 2018/0286962 | A1 | 10/2018 | Bao et al. |
| 2018/0308680 | A1* | 10/2018 | Reddy ................... C23C 16/505 |
| 2019/0203054 | A1 | 7/2019 | Seki |
| 2020/0066512 | A1 | 2/2020 | Tois et al. |
| 2020/0105515 | A1* | 4/2020 | Maes ................ H01L 21/76883 |
| 2020/0234943 | A1* | 7/2020 | Bhuyan ............. C23C 16/45525 |
| 2020/0354834 | A1* | 11/2020 | De Silva ................. C23C 16/04 |
| 2021/0111025 | A1 | 4/2021 | Zyulkov et al. |
| 2021/0301391 | A1* | 9/2021 | Givens .................... C23C 16/56 |
| 2022/0238323 | A1 | 7/2022 | Clark |
| 2023/0203644 | A1 | 6/2023 | Givens et al. |
| 2023/0343581 | A1 | 10/2023 | Brick |
| 2024/0030026 | A1 | 1/2024 | Miyata et al. |
| 2025/0112041 | A1 | 4/2025 | Brick et al. |

FOREIGN PATENT DOCUMENTS

| | | | |
|---|---|---|---|
| JP | 2019-121777 | A | 7/2019 |
| JP | 2020-056104 | A | 4/2020 |
| JP | 2020-520126 | A | 7/2020 |
| KR | 101856143 | B1 | 5/2018 |
| KR | 20210043460 | A | 4/2021 |
| KR | 20210122684 | A | 10/2021 |
| KR | 102855628 | B1 | 9/2025 |
| TW | 201930626 | A | 8/2019 |
| TW | 202116932 | A | 5/2021 |
| TW | 202342796 | A | 11/2023 |
| WO | 2018213018 | A1 | 11/2018 |
| WO | 202206683 | A1 | 3/2022 |
| WO | 2022066830 | A1 | 3/2022 |
| WO | 2022104226 | A1 | 5/2022 |
| WO | 2022264430 | A1 | 12/2022 |
| WO | 2023205332 | A1 | 10/2023 |

OTHER PUBLICATIONS

Bobb-Semple et al., "Area-Selective Atomic Layer Deposition Assisted by Self-Assembled Monolayers: A Comparison of Cu, Co, W, and Ru," Chem. Mater., vol. 31, pp. 1635-1645 (2019).

Hashemi et al., "Selective Deposition of Dielectrics: Limits and Advantages of Alkanethiol Blocking Agents on Metal-Dielectric Patterns," ACS Applied Materials & Interfaces, vol. 8, pp. 33264-33272 (2016).

Hashemi et al., "Sequential Regeneration of Self-Assembled Monolayers for Highly Selective Atomic Layer Deposition," Advanced Materials Interfaces, vol. 3, pp. 1600464, 7 pages (2016).

International Search Report and Written Opinion issued Aug. 1, 2023 in Application No. PCT/US2023/019255.

International Search Report and Written Opinion issued Aug. 29, 2023 in Application No. PCT/US2023/019263.

Ju et al., "Molecular layer deposition using cyclic azasilanes, maleic anhydride, trimethylaluminum1 and water," J. Vac. Sci. Technol. A, vol. 35, No. 1, pp. 01B136-1-01B136-8 (2017).

Mameli et al., "Area-Selective Atomic Layer Deposition of SiO2 Using Acetylacetone as a Chemoselective Inhibitor in an ABC-Type Cycle," ACS Nano vol. 11, pp. 9303-9311 (2017).

Nguyen et al., "Selective deposition of AlOx for Fully Aligned Via in nano Cu interconnects.," 2021 IEEE International Interconnect Technology Conference (IITC), pp. 1-2 (2021).

Office Action and Search Report issued Feb. 15, 2024 in TW Application No. 112115009, with partial English translation.

Pasquali et al., "Area-Selective Deposition of AlOx and Al-Silicate for Fully Self-Aligned Via Integration," ACS Applied Materials & Interfaces, vol. 15, No. 4, pp. 6079-6091 (2023).

Pasquali et al., "Understanding Selectivity Loss Mechanisms in Selective Material Deposition by Area Deactivation on 10 nm Cu/SIO2 Patterns," ACS Applied Electronic Materials, vol. 4, pp. 1703-1714 (2022).

Sampson et al., "Inhibiting Metal Oxide Atomic Layer Deposition: Beyond Zinc Oxide," ACS Applied Materials & Interfaces, vol. 9, pp. 33429-33436 (2017).

Yu et al., "Area-Selective Molecular Layer Deposition of a Silicon Oxycarbide Low-k Dielectric," Chem. Mater., vol. 33, pp. 902-909 (2021).

Office Action and Search Report issued Feb. 20, 2024 in TW Patent Application No. 112115027, with English translation of Search Report only.

Gasvoda et al., "Selective Gas-Phase Functionalization of SiO2 and SiNx surfaces with Hydrocarbons," Langmuir, vol. 37, No. 13, pp. 3960-3969 (2021).

International Search Report and Written Opinion issued Nov. 27, 2024 in Application No. PCT/US2024/038592.

International Preliminary Report on Patentability issued Oct. 8, 2024 in Application No. PCT/US2023/019255.

International Preliminary Report on Patentability issued Oct. 8, 2024 in Application No. PCT/US2023/019263.

Office Action and Search Report issued Feb. 20, 2025 in TW Application No. 113127161, with brief summary of Office Action and English translation of search report.

Office Action issued Jul. 1, 2025 in U.S. Appl. No. 18/137,128, by Brick.

Office Action issued Oct. 17, 2025 in KR Application No. 10-2024-7038670.

Office Action issued Nov. 3, 2025 in U.S. Appl. No. 18/137,128, by Brick.

Office Action issued Nov. 25, 2025 in CA Application No. 3255871.

Office Action issued Dec. 2, 2025 in JP Application No. 2024-561903.

(56) References Cited

OTHER PUBLICATIONS

Office Action issued Dec. 16, 2025 in JP Application No. 2024-561904.
Office Action issued May 18, 2026 in U.S. Appl. No. 18/137,128, Brick.
Office Action issued May 25, 2026 in KR Application No. 10-2024-7038673.
Notice of Allowance issued Aug. 4, 2026 in Korean Patent Application No. 10-2024-7038670, by Brick.
Office Action issued Jul. 7, 2026 in JP Application No. 2024-561904.

* cited by examiner

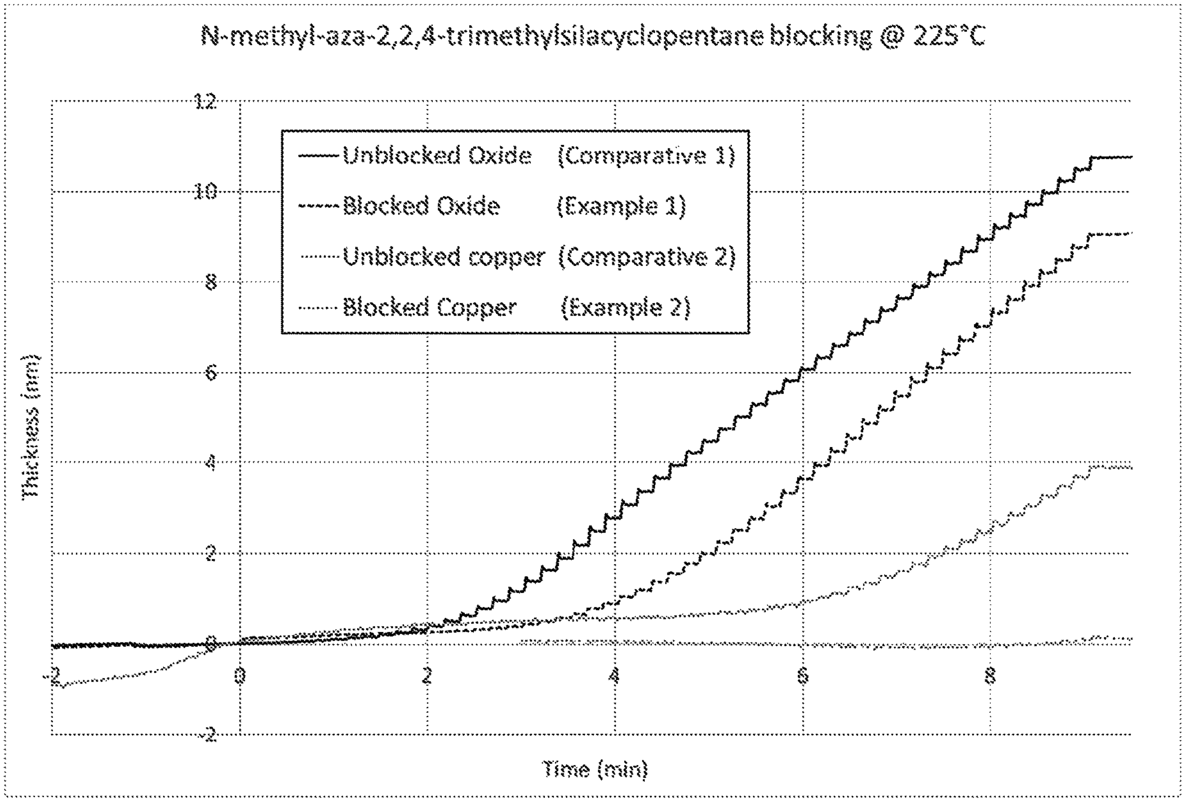
Thickness v. Time for Films of Examples 1 and 2 and Comparative Examples 1 and 2

AREA SELECTIVE ATOMIC LAYER DEPOSITION OF METAL OXIDE OR DIELECTRIC LAYER ON PATTERNED SUBSTRATE

CROSS REFERENCE TO RELATED APPLICATION

This application claims priority to U.S. Provisional Patent Application No. 63/333,286, filed Apr. 21, 2022, the disclosure of which is herein incorporated by reference in its entirety.

BACKGROUND OF THE INVENTION

As pattern sizes shrink during semiconductor manufacture, alignment of masks with the existing features on a substrate has become a critical impediment to further reduction in feature size. Misalignment of substrate and mask results in edge-placement error, which is the difference between the desired and actual position of a feature on the device. These discrepancies can result in both immediate device failure and time-dependent dielectric breakdown, impacting device reliability. Additionally, in the case of via contact to metal lines, edge placement error can result in increased capacitance between a via and a neighboring metal line, as well as decrease the contact area between the via and the target line, increasing resistance. The resulting RC delay can significantly degrade device performance by slowing the switching speed of the transistors.

One method for avoiding the problem of edge placement error is to create fully self-aligned vias (FSAV) where a dielectric film is grown selectively on the existing dielectric layer, without growth on the metal lines. Such area-selective deposition (ASD) can alleviate these manufacturing challenges by enabling bottom-up material placement without the use of masks. In the case of FSAV, the topography created by an ASD dielectric-on-dielectric (DoD) process affords greater vertical distance between subsequent metal layers, allowing for greater latitude in horizontal misplacement or larger critical-dimension (CD) vias. A number of previously described schemes have involved the deposition of ASD DoD layers, but few have been able to achieve the desired film thickness of 5 to 10 nm while simultaneously meeting other film property and manufacturability targets.

SUMMARY OF THE INVENTION

In one embodiment, the disclosure relates to a method for selectively depositing a metal oxide or dielectric layer on a patterned substrate, the method comprising:

(a) introducing a patterned substrate having metallic and non-metallic regions into a reaction zone of a deposition chamber and heating the reaction zone to about 175° C. to about 350° C.;

(b) exposing the patterned substrate to a pulse of a heteroatom silacyclic compound and purging the deposition chamber; and (c) performing an atomic layer deposition or chemical vapor deposition on the patterned substrate to form a metal oxide or dielectric layer on the substrate;

where the metal oxide or dielectric layer selectively forms on the non-metallic regions of the patterned substrate.

BRIEF DESCRIPTION OF THE SEVERAL VIEWS OF THE DRAWINGS

The following detailed description of preferred embodiments of the present invention will be better understood when read in conjunction with the appended drawing. For the purposes of illustrating the invention, there is shown in the drawing an embodiment which is presently preferred. It is understood, however, that the invention is not limited to the precise arrangements and instrumentalities shown. In the drawing:

FIG. 1 is a graph of thickness v. time for the films of Examples 1 and 2 and Comparative Examples 1 and 2.

DETAILED DESCRIPTION OF THE INVENTION

Aspects of the disclosure relate to a method for the formation of area-selective deposition dielectric-on-dielectric (ASD DoD) layers by first reacting a patterned substrate with a heteroatom silacyclic compound, and then performing metal oxide atomic layer deposition (ALD) growth using sequential metal alkyl and water pulses or chemical vapor deposition (CVD) growth using concurrent addition of metal alkyl and water to selectively grow the resulting metal oxide or dielectric layer or film on the non-metallic portion of the patterned substrate.

It has been discovered that at sufficiently high temperatures, such as from about 175° C. to about 350° C., preferably about 225° C. to about 275° C., the exposure of a metallic surface to a heteroatom silacyclic compound results in significant inhibition of film growth upon subsequent exposure to metal-oxide forming deposition processes. Specifically, the heteroatom silacyclic compound acts as a blocking group to manipulate the growth of metal oxides, such as zinc oxide, on various patterned substrates. While an inhibition effect on non-metallic substrates is also observed after exposure to heteroatom silacyclic compounds, this effect is greater on the metallic portion of the substrate, resulting in selective growth of the metal oxide film on the non-metallic area of the substrate. Zinc oxide films of over seven nm in thickness have been grown on thermal oxide substrates without growth on copper under identical conditions. Considering as a specific example a PVD copper on silicon patterned substrate, it has been found that at sufficiently high temperatures (such as about 175° C. to about 350° C., particularly about 225° C. to 275° C.), the heteroatom silacyclic compound blocking layer delays the growth of a zinc oxide film on the copper portions of the substrate, thus enabling selective growth on the silicon portions.

The method according to the disclosure involves introducing a patterned substrate having metallic and non-metallic regions into a reaction zone of a deposition chamber and heating the reaction zone to about 175° C. to about 350° C., exposing the patterned substrate to a pulse of a heteroatom silacyclic compound and purging the deposition chamber, and then performing an ALD or CVD on the patterned substrate to form a metal oxide or dielectric layer or film. For the purposes of this disclosure, the terms "layer" and "film" may be understood to be synonymous. In one embodiment, the ALD involves exposing the substrate (now containing a blocking layer) to the following sequence of steps which are repeated as many times as necessary to achieve the desired film thickness: exposing the substrate to a pulse of a metal alkyl compound, purging the deposition chamber, exposing the substrate to a pulse of deionized water, and purging the deposition chamber. The resulting metal oxide or dielectric layer selectively forms on non-metallic regions of the patterned substrate.

In some embodiments, prior to exposing the substrate to the heteroatom silacyclic compound, it is within the scope of the disclosure to pretreat the substrate. The pretreatment may be accomplished by chemical, structural, or plasma pre-treatment methods which are well known in the art. For example, the substrate may be pretreated by washing in ethanol, isopropanol, citric acid, or acetic acid-based formulations, or by exposing the substrate to 60 seconds of N2 remote inductively coupled plasma at 225° C. to 250° C. Other similar substrate pre-treatment processes which are known in the art would also be applicable. Such treatments may improve performance of the resulting films, but the appropriate pretreatment method and conditions may be determined on a case-to-case basis depending on the specific substrate, apparatus, reactants, and reaction conditions.

In some embodiments, after a number of metal alkyl exposure/purge/water exposure/purge sequences (such as about 1 to about 50 sequences) have been completed, the substrate is subjected to a pulse of a plasma treatment, such as for about 10 seconds. For example, a sequence of five exposure/pulse sequences may be performed prior to performing the plasma treatment. This sequence of five (for example) exposure/pulse sequences followed by a plasma pulse may be referred to as a "super cycle." Such a super cycle may then be repeated as many times as required to form a metal oxide or dielectric film having the desired thickness. In some embodiments, it is also within the scope of the disclosure to perform a plasma treatment step before or after any of the exposure or purging steps.

It is within the scope of the disclosure to prepare metal oxide or dielectric films having thicknesses of 5 to 10 nm, particularly 7 nm to 10 nm, which thicknesses are currently desirable in the microelectronic industry, and further to prepare metal oxide or dielectric films having thicknesses of up to about 50 nm. The desired film or layer thickness may be achieved by repeating the method steps described herein repeatedly.

A variety of metal alkyl compounds may be employed in the method described herein, including, without limitation, Group 12 and Group 13 metal alkyl compounds. Exemplary metal alkyl compounds which may be employed include the presently preferred diethylzinc, trimethylaluminum, and dimethylaluminum isopropoxide, as well as dimethylzinc, trimethylgallium, triethylgallium, triethylaluminum, trimethylindium, dimethylcadmium, and dimethylmercury.

The blocking layer on the patterned substrate is applied by exposing the substrate to a pulse of a heteroatom silacyclic compound, such as a cyclic azasilane, cyclic tellurasilane, or cyclic thiasilane compound.

Appropriate cyclic azasilanes have general formula (1):

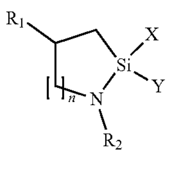

(1)

In formula (1), $R_1$ is hydrogen or a linear, branched, or cyclic, optionally substituted, alkyl, aryl, alkynyl, alkenyl, alkoxy, silyl, or alkylamino group having 1 to about 12 carbon atoms (preferably 1 to about 4 carbon atoms), $R_2$ is a linear, branched, or cyclic, optionally substituted, alkyl, aryl, alkynyl, alkenyl, alkoxy, silyl, or alkylamino group having 1 to about 12 carbon atoms (preferably 1 to about 4 carbon atoms), n is an integer of 1 to about 4, and X and Y are each independently a linear, branched, or cyclic, optionally substituted, alkyl, aryl, alkynyl, alkenyl, alkoxy, silyl, or alkylamino group (preferably about 1 to about 4 carbon atoms). It is within the scope of the disclosure for $R_1$, $R_2$, X, and Y to be unsubstituted or substituted with groups such as, without limitation, alkyl (such as methyl, ethyl, or propyl), alkoxysilyl (such as trimethoxysilyl or triethoxysilyl), alkoxy (such as methoxy or alkoxy), and/or halogen (such as chloro, bromo, fluoro, or iodo).

Exemplary $R_1$, $R_2$, X, and Y substituents include, without limitation, hydrogen, methyl, ethyl, n-propyl, i-propyl, n-butyl, s-butyl, t-butyl, pentyl, hexyl, phenyl, cyclohexyl, heptyl, n-octyl, 2-ethylhexyl, nonyl, decyl, dodecyl, octadecyl, methoxy, ethoxy, n-propoxy, i-propoxy, n-butoxy, s-butoxy, t-butoxy, vinyl, allyl, norbornenyl, methylnorbornenyl, ethylnorbornenyl, propylnorbornenyl, trimethylsilyl, trimethoxysilyl, methyl(trimethoxysilyl), ethyl (trimethoxysilyl), propyl(trimethoxysilyl), triethoxysilyl, methyl(triethoxysilyl), ethyl(triethoxysilyl), propyl(triethoxysilyl), amino, methylamino, ethylamino, propylamino, methyl(dimethylamino), ethyl(dimethylamino), propyl(dimethylamino), and chloromethyl.

Preferably, $R_1$ is hydrogen or an alkyl group such as methyl or ethyl, $R_2$ is an optionally substituted alkyl, alkenyl, or alkylamino group having 1 to about 4 carbon atoms, such as 1, 2, 3, or 4 carbon atoms, and X and Y are preferably alkyl or alkoxy groups having 1 to about 4 carbon atoms, such as 1, 2, 3, or 4 carbon atoms.

Exemplary cyclic azasilane compounds which would be effective for forming a blocking layer on the patterned substrate include, without limitation, (N-methyl-aza-2,2,4-trimethyl silacyclopentane, N-(2-aminoethyl)-2,2,4-trimethyl-1-aza-silacyclopentane, N-n-butyl-aza-2,2-dimethoxysilacyclopentane, N-ethyl-2,2-dimethoxy-4-methyl-1-aza-2-silacyclopentane, (N,N-dimethylaminopropyl)-aza-2-methyl-2-methoxysilacyclopentane, (1-(3-triethoxysilyl) propyl)-2,2-diethoxy-1-aza-silacyclopentane, N-allyl-aza-2,2-dimethoxysilacyclopentane, and N-t-butyl-aza-2,2-diemethoxysilacyclopentane, and have the following structures:

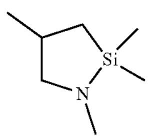

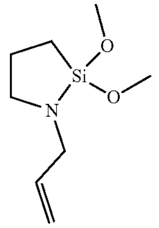

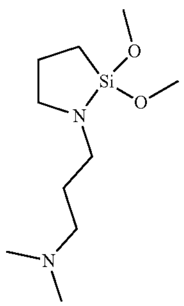

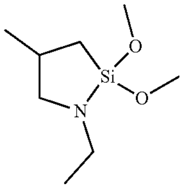

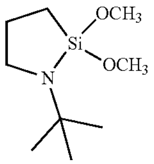

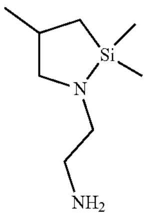

-continued

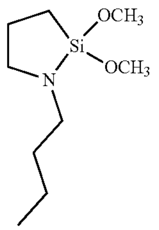

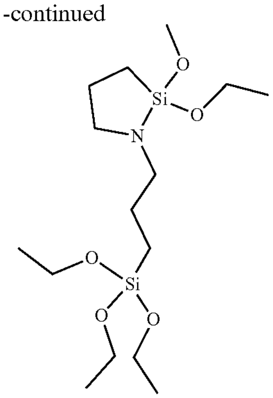

Appropriate cyclic thiasilanes have general formula (2):

(2)

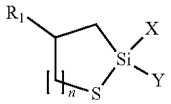

In formula (2), $R_1$, n, X, and Y are as described above. Preferably, $R_1$ is hydrogen or an alkyl group such as methyl or ethyl, and X and Y are preferably alkyl or alkoxy groups having 1 to about 4 carbon atoms, such as 1, 2, 3, or 4 carbon atoms.

An exemplary cyclic thiasilane compound which would be effective for forming a blocking layer on the patterned substrate is 2,2,4-trimethyl-1-thia-2-silacyclopentane and has the following structure:

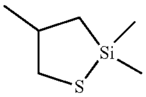

Appropriate cyclic tellurasilanes have general formula (3):

(3)

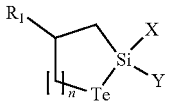

In formula (3), $R_1$, n, X, and Y are as described above. Preferably, $R_1$ is hydrogen or an alkyl group such as methyl or ethyl, and X and Y are preferably alkyl or alkoxy groups having 1 to about 4 carbon atoms, such as 1, 2, 3, or 4 carbon atoms.

An exemplary cyclic tellurasilane compound which would be effective for forming a blocking layer on the patterned substrate is 2,2,4-trimethyl-1-tellura-2-silacyclopentane and has the following structure:

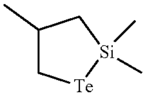

The presently preferred compounds for use in the methods described herein are cyclic azasilanes, and in particular N-methyl-aza-2,2,4-trimethylsilacyclopentane is the preferred compound for forming a blocking layer on the patterned substrate:

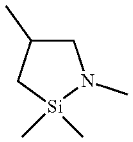

The parameters of the purge cycles are not particularly limited, and may be optimized based on the specific reaction conditions, apparatus, and reactants. Generally, any inert gas such as argon or nitrogen may be employed; typical purge cycles are at least about two seconds long. In preferred embodiments, the purges are about 5 seconds (following the metal alkyl pulses and the water pulses) and about 30 seconds following the pulse of the heteroatom silacyclic compound.

The temperatures of the substrate and the reaction zone of the deposition chamber are critical for producing an effective blocking layer of heteroatom silacyclic compound. Specifically, the temperatures of the substrate and of the reaction zone at least during deposition of the metal oxide or dielectric layer are preferably about 175° C. to about 350° C., more preferably about 225° C. to about 275° C. It may be understood that the ranges of substrate temperatures are inclusive of all temperatures within the range, so that temperatures of about 175° C. to about 350° C. include temperatures such as about 200° C., about 225° C., about 250° C., about 275° C., about 300° C., about 325° C., about 300° C., about 325° C., and all temperatures in between.

If the deposition of the blocking layer is performed in the same deposition chamber and under the same reaction conditions as the metal oxide or dielectric layer, the substrate and reaction zone of the deposition temperature may be in this temperature range as well. Optionally, the blocking layer may be applied in the same or different reaction chamber at a different temperature, such as from about 20° C. to about 325° C., inclusive of all temperatures within this range.

The pulse lengths of each reactant may also be optimized based on the specific reaction conditions and apparatus and are generally kept as short as practical. The pulse lengths for the metal alkyl compound and the water may be as short as 0.05 seconds or about 1 second in some embodiments. The pulse lengths of the heteroatom silacyclic compound are relatively short, such as at least about 0.1 second, preferably about 0.1 to about 10 seconds, more preferably about 2 to about 6 seconds, even more preferably about 3 to about 5 seconds, even more preferably about 5 seconds.

It is within the scope of the disclosure to move the reactants, such as the heteroatom silacyclic compound and metal alkyl compound, in a carrier gas. Without limitation, any noble gas, such as argon, or other inert gas, such as nitrogen, would be appropriate. However, it is also within the scope of the disclosure not to employ a carrier gas.

A variety of different types of patterned substrates are appropriate for use in the method described herein, provided that they contain metallic and non-metallic regions. Appropriate substrates include, without limitation, the presently preferred silicon dioxide and copper on silicon. Other possible substrates which would be appropriate include, without limitation, substrates containing non-metallic regions comprising silicon, germanium, silicon-germanium alloy, silicon dioxide, silicon nitride, titanium nitride, tantalum nitride, silicon oxycarbide, silicon oxynitride, silicon carboxynitride, aluminum oxide, hafnium dioxide, titanium dioxide, and/or zinc oxide, and substrates containing metallic regions comprising copper, cobalt, tungsten, ruthenium, and/or molybdenum.

The invention will now be described in connection with the following, non-limiting examples.

Comparative Example 1

Zinc oxide was grown on thermally-grown silicon dioxide cleaned with 60 seconds of N2 remote inductively coupled plasma (2500 W) at 225° C. using an alternating pulse sequence of 0.1 seconds diethylzinc, 5 second purge, 0.1 seconds water, and 5 second purge, repeated 50 times. Film growth was immediate at 2.8 angstroms per cycle. The thickness of the film after 24 cycles was 5.0 nm.

Comparative Example 2

PVD copper on silicon was cleaned by washing for five minutes in ethanol. Zinc oxide was grown on the cleaned copper by exposing the copper substrate to 60 seconds of N2 remote inductively coupled plasma (2500 W) at 225° C. and then further subjecting it to an alternating pulse sequence of 0.1 seconds diethylzinc, 5 second purge, 0.1 seconds water, and 5 second purge, repeated 50 times. Slight film growth of 7 angstroms was observed in the first 24 cycles, after which ALD-like growth began, reaching 2.6 angstroms per cycle by the final cycle.

Example 1

Thermally-grown silicon dioxide cleaned with 60 seconds of N2 remote inductively coupled plasma (2500 W) at 225° C. and then exposed to N-methyl-aza-2,2,4-trimethylsilacyclopentane for five seconds, followed by a 30 s purge. Subsequently, the substrate was exposed to an alternating pulse sequence of 0.1 seconds diethylzinc, 5 second purge, 0.1 seconds water, and 5 second purge, repeated 50 times. Film growth began on the eleventh cycle and reached 3.0 angstroms per cycle by the final cycle. Film thickness at the forty-fourth cycle was 7.3 nm.

Example 2

PVD copper on silicon was cleaned by washing for five minutes in ethanol. The copper was then exposed to 60 seconds of N2 remote inductively coupled plasma (2500 W) at 225° C. and then further exposed to N-methyl-aza-2,2,4-trimethylsilacyclopentane for five seconds, followed by a 30 s purge. Subsequently, the substrate was exposed to an alternating pulse sequence of 0.1 seconds diethylzinc, 5 second purge, 0.1 seconds water, and 5 second purge, repeated 50 times. Film growth began on the forty-fourth cycle and remained below 1 angstrom per cycle until the final cycle.

The following Table 1 summarizes the steps performed in Examples 1 and 2; Step 2 is omitted in Comparative Examples 1 and 2. The thickness v. time data for the films prepared in Examples 1 and 2 and Comparative Examples 1 and 2 are shown in FIG. 1.

It is observed that without the application of heteroatom silacyclic compound, growth on a non-metallic oxide surface begins immediately, while growth on copper metal is slow for about 30 cycles, before ALD-like deposition of metal oxide initiates. The thickness gap between the growth on the non-metallic and metallic surface is insufficient for most ASD DoD schemes and the slow growth observed on copper during the first thirty cycles would require further process steps to clean or mitigate. In contrast, the application of a heteroatom silacyclic compound before the start of the metal oxide deposition process results in both a larger thickness gap between the two surfaces and no sign of metal oxide growth on copper for over forty cycles. This affords a >7 nm thick ASD DoD layer on the non-metallic surface while retaining a metallic surface without deposited metal oxide or dielectric film. This thickness is sufficient for FSAV schemes.

TABLE 1

| Pulse Sequences for Examples 1 and 2 | |
|---|---|
| 1: | 60 s $N_2$ plasma pre-clean (2500 W) |
| 2: | 5.0 s N-methyl-aza-2,2,4-trimethylsilacyclopentane, 30 s purge |
| 3: | 0.1 s diethyl zinc, 5 s purge |
| 4: | 0.1 s water, 5 s purge |
| 5: | Repeat steps 3 and 4 forty-nine additional times |

It will be appreciated by those skilled in the art that changes could be made to the embodiments described above without departing from the broad inventive concept thereof. It is understood, therefore, that this invention is not limited to the particular embodiments disclosed but it is intended to cover modifications within the spirit and scope of the present invention as defined by the appended claims.

I claim:

1. A method for selectively depositing a metal oxide or dielectric layer on a patterned substrate, the method comprising:

(a) introducing a patterned substrate having metallic and non-metallic regions into a reaction zone of a deposition chamber and heating the reaction zone to about 175° C. to about 350° C.;

(b) exposing the patterned substrate to a pulse of a heteroatom silacyclic compound comprising N, S, or Te and purging the deposition chamber; and (c) performing an atomic layer deposition or chemical vapor deposition on the patterned substrate to form a metal oxide or dielectric layer on the patterned substrate;

where upon exposure to the metallic regions, the heteroatom silacyclic compound reacts with the metallic regions and blocks deposition such that the metal oxide or dielectric layer selectively forms on the non-metallic regions of the patterned substrate.

2. The method according to claim 1, wherein step (c) comprises:

(d) exposing the patterned substrate to a pulse of a metal alkyl compound;

(e) purging the deposition chamber;

(f) exposing the patterned substrate to a pulse of water;

(g) purging the deposition chamber; and (h) repeating steps (d) to (g) until a desired metal oxide or dielectric layer thickness is achieved.

3. The method according to claim 2, further comprising performing at least one plasma treatment step before or after any of steps (a) to (g).

4. The method according to claim 2, wherein the metal alkyl compound is a Group 12 or Group 13 metal alkyl compound.

5. The method according to claim 4, wherein the metal alkyl compound is selected from diethylzinc, trimethylaluminum, dimethylaluminum isopropoxide, dimethylzinc, trimethylgallium, triethylgallium, triethylaluminum, trimethylindium, dimethylcadmium, and dimethylmercury.

6. The method according to claim 1, further comprising performing a plasma treatment step prior to step (a).

7. The method according to claim 1, wherein the heteroatom silacyclic compound is a cyclic azasilane having formula (1), a cyclic thiasilane having formula (2), or a cyclic tellurasilane having formula (3):

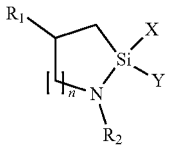
(1)

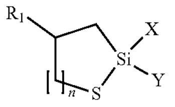
(2)

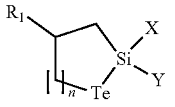
(3)

wherein $R_1$ is hydrogen or a linear, branched, or cyclic, optionally substituted, alkyl, aryl, alkynyl, alkenyl, alkoxy, silyl, or alkylamino group having 1 to about 12 carbon atoms, $R_2$ is a linear, branched, or cyclic, optionally substituted, alkyl, aryl, alkynyl, alkenyl, alkoxy, silyl, or alkylamino group having 1 to about 12 carbon atoms, n is an integer of 1 to about 4, and X and Y are each independently a linear, branched, or cyclic, optionally substituted, alkyl, aryl, alkynyl, alkenyl, alkoxy, silyl, or alkylamino group.

8. The method according to claim 7, wherein the heteroatom silacyclic compound is (N-methyl-aza-2,2,4-trimethylsilacyclopentane, N-(2-aminoethyl)-2,2,4-trimethyl-1-azasilacyclopentane, N-n-butyl-aza-2,2-dimethoxysilacyclopentane, N-ethyl-2,2-dimethoxy-4-methyl-1-aza-2-silacyclopentane, (N,N-dimethylaminopropyl)-aza-2-methyl-2-methoxysilacyclopentane, (1-(3-triethoxysilyl) propyl)-2,2-diethoxy-1-aza-silacyclopentane, N-allyl-aza-2,2-dimethoxysilacyclopentane, N-t-butyl-aza-2,2-diemethoxysilacyclopentane, 2,2,4-trimethyl-1-thia-2-silacyclopentane, or 2,2,4-trimethyl-1-tellura-2-silacyclopentane.

9. The method according to claim 1, wherein the metallic region of the substrate comprises at least one of copper, cobalt, tungsten, ruthenium, and molybdenum.

10. The method according to claim 1, wherein the non-metallic region of the substrate comprises at least one of silicon, germanium, silicon-germanium alloy, silicon dioxide, silicon nitride, titanium nitride, tantalum nitride, silicon oxycarbide, silicon oxynitride, silicon carboxynitride, aluminum oxide, hafnium dioxide, titanium dioxide, and zinc oxide.

11. The method according to claim 1, wherein the substrate comprises silicon dioxide or copper on silicon.

12. The method according to claim 1, wherein the pulse of the heteroatom silacyclic compound in step (b) is at least about 0.1 seconds.

13. The method according to claim 12, wherein the pulse of the heteroatom silacyclic compound in step (b) is about 0.1 seconds to about 10 seconds.

14. The method according to claim 13, wherein the pulse of the heteroatom silacyclic compound in step (b) is about 5 seconds.

15. The method according to claim 1, wherein the reaction zone in step (a) is heated to about 225° C. to about 275° C.

16. The method according to claim 1, wherein the dielectric film has a thickness of about 5 nm to about 50 nm.

17. The method according to claim 16, wherein the dielectric film has a thickness of about 5 nm to about 10 nm.

18. The method according to claim 1, wherein step (b) forms a blocking layer on the patterned substrate which delays formation of the metal oxide or dielectric layer on the metallic region.

19. The method according to claim 1, wherein step (c) comprises:

(d) exposing the patterned substrate to a pulse of a metal alkyl compound;
(e) purging the deposition chamber;
(f) exposing the patterned substrate to a pulse of water;
(g) purging the deposition chamber;
(h) repeating steps (d) to (g) at least one time;
(i) performing a plasma treatment step; and
(j) repeating steps (d) to (i) until a desired metal oxide or dielectric layer thickness is achieved.

20. The method according to claim 19, wherein the metal alkyl compound is a Group 12 or Group 13 metal alkyl compound.

21. The method according to claim 20, wherein the metal alkyl compound is selected from diethylzinc, trimethylaluminum, dimethylaluminum isopropoxide, dimethylzinc, trimethylgallium, triethylgallium, triethylaluminum, trimethylindium, dimethylcadmium, and dimethylmercury.

22. The method according to claim 1, wherein the metal oxide or dielectric layer is formed from a metal alkyl compound.

* * * * *